(12) United States Patent
Koide et al.

(10) Patent No.: US 6,608,667 B2
(45) Date of Patent: Aug. 19, 2003

(54) EXPOSURE APPARATUS AND DEVICE MANUFACTURING METHOD

(75) Inventors: Hiroyuki Koide, Tochigi (JP); Kazuhito Outsuka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/771,979

(22) Filed: Jan. 30, 2001

(65) Prior Publication Data
US 2001/0024269 A1 Sep. 27, 2001

(30) Foreign Application Priority Data
Feb. 2, 2000 (JP) ........................ 2000-024937

(51) Int. Cl.$^7$ ........................ G03B 27/72; G03B 27/42
(52) U.S. Cl. ........................ 355/69; 355/53; 355/71
(58) Field of Search ................. 355/52, 53, 55, 355/67–71, 77; 356/399–401; 250/548

(56) References Cited

U.S. PATENT DOCUMENTS

| | | | |
|---|---|---|---|
| 5,486,896 A | | 1/1996 | Hazama et al. ............ 355/71 |
| 5,591,958 A | * | 1/1997 | Nishi et al. ............ 250/205 |
| 5,898,477 A | * | 4/1999 | Yoshimura et al. ........ 355/53 |
| 5,925,887 A | | 7/1999 | Sakai et al. ............ 250/548 |
| 5,936,711 A | * | 8/1999 | Miyai et al. ............ 355/55 |
| 6,259,510 B1 | * | 7/2001 | Suzuki .................. 355/53 |
| 6,295,119 B1 | * | 9/2001 | Suzuki .................. 355/53 |

FOREIGN PATENT DOCUMENTS

| | | |
|---|---|---|
| JP | 4-311025 | 11/1992 |
| JP | 8-330220 | 12/1996 |
| JP | 11-260716 | 9/1999 |

* cited by examiner

Primary Examiner—Henry Hung Nguyen
(74) Attorney, Agent, or Firm—Fitzpatrick, Cella, Harper & Scinto

(57) ABSTRACT

An exposure apparatus has an illumination system for transferring a reticle pattern formed on a reticle as a master onto a wafer as a photosensitive member by a laser source, a stop for setting an illumination region by the laser source, and a mechanism for synchronously scanning the reticle and wafer in predetermined scanning directions. Exposure processing by synchronous scanning of the reticle and wafer and relative movement of the wafer in a direction crossing the scanning direction are repeated, thereby forming a transfer pattern with connected exposure regions on the wafer. The stop driving mechanism performs exposure while driving a vane of the stop for setting the illumination region in the direction perpendicular to the scanning direction in the direction crossing the scanning direction during the exposure processing.

37 Claims, 16 Drawing Sheets

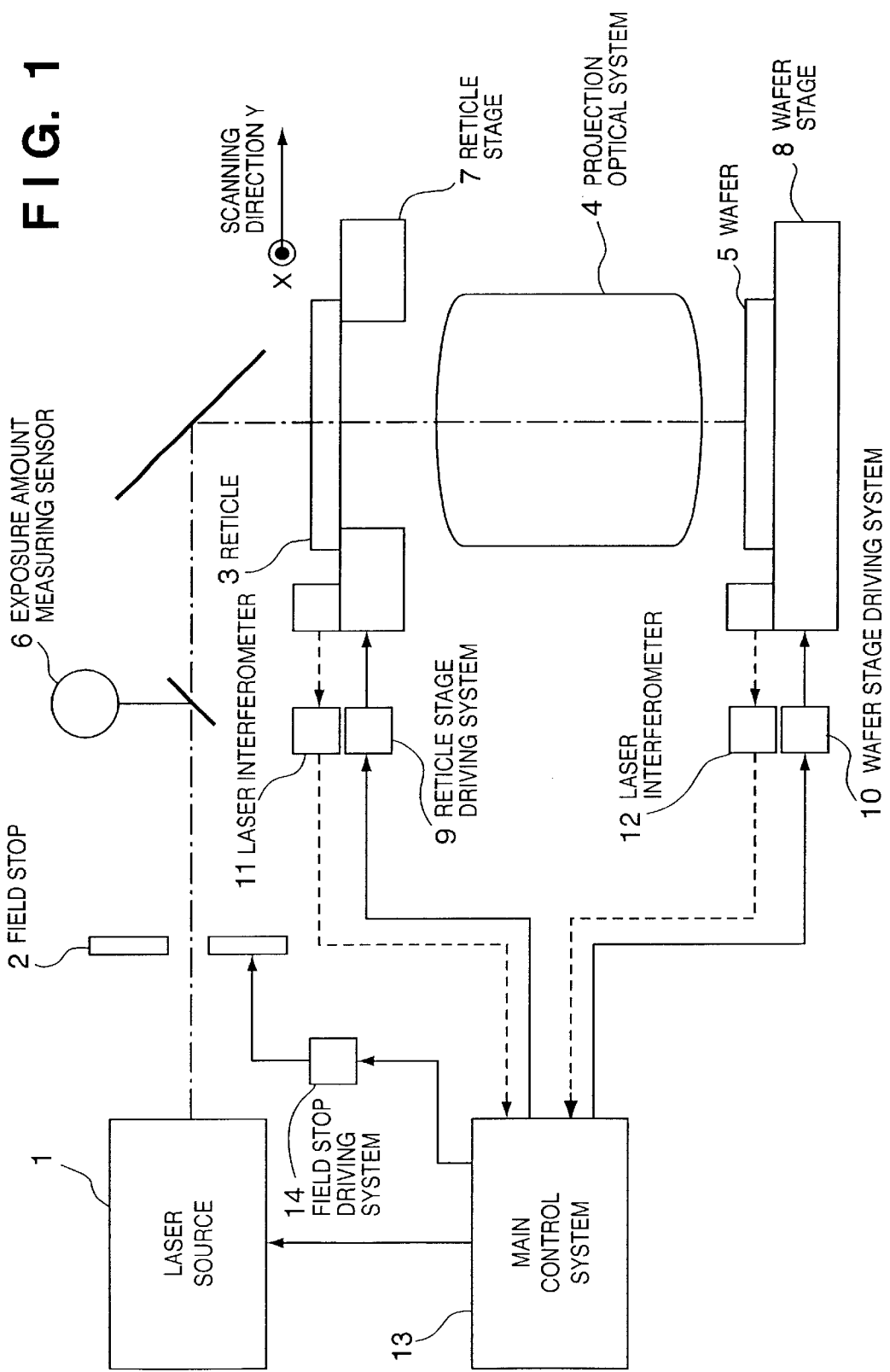

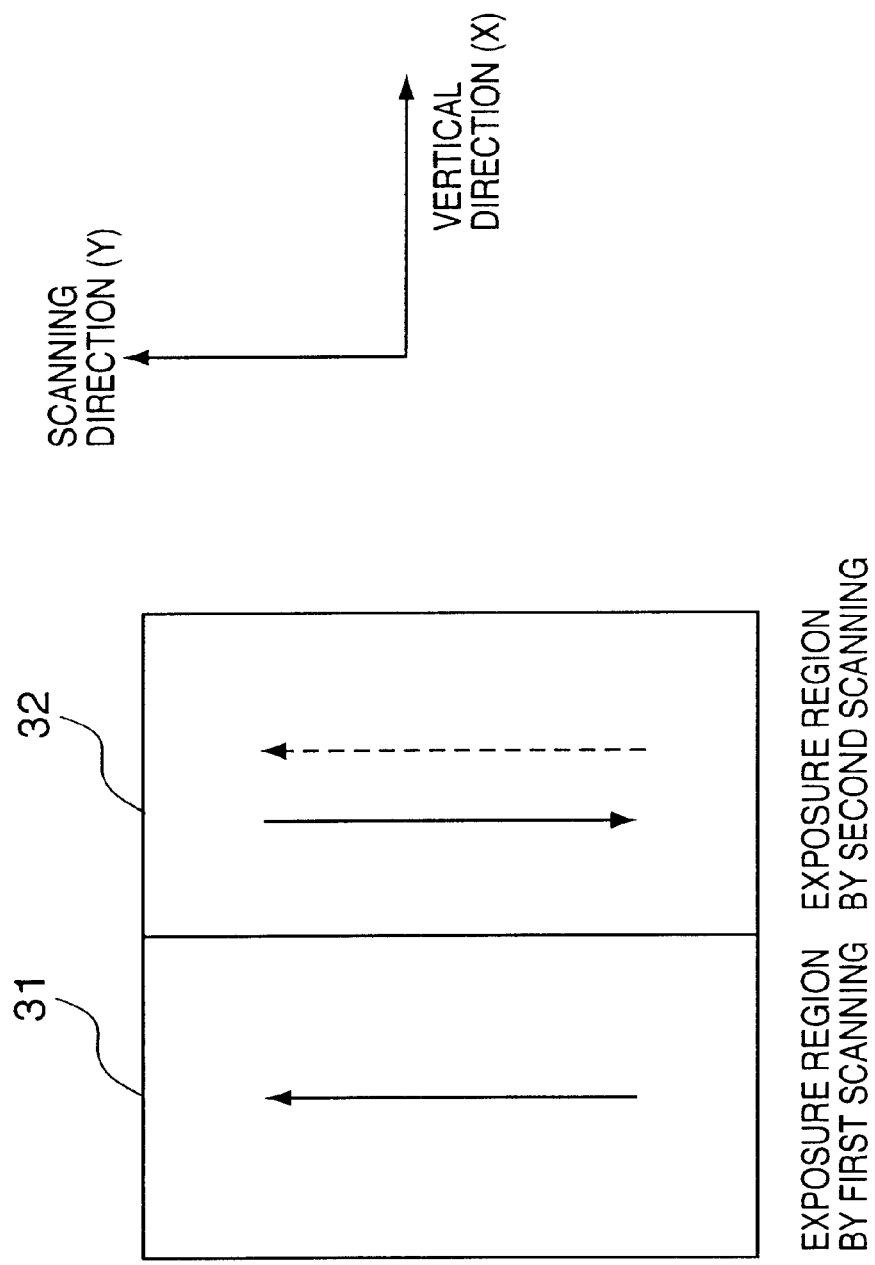

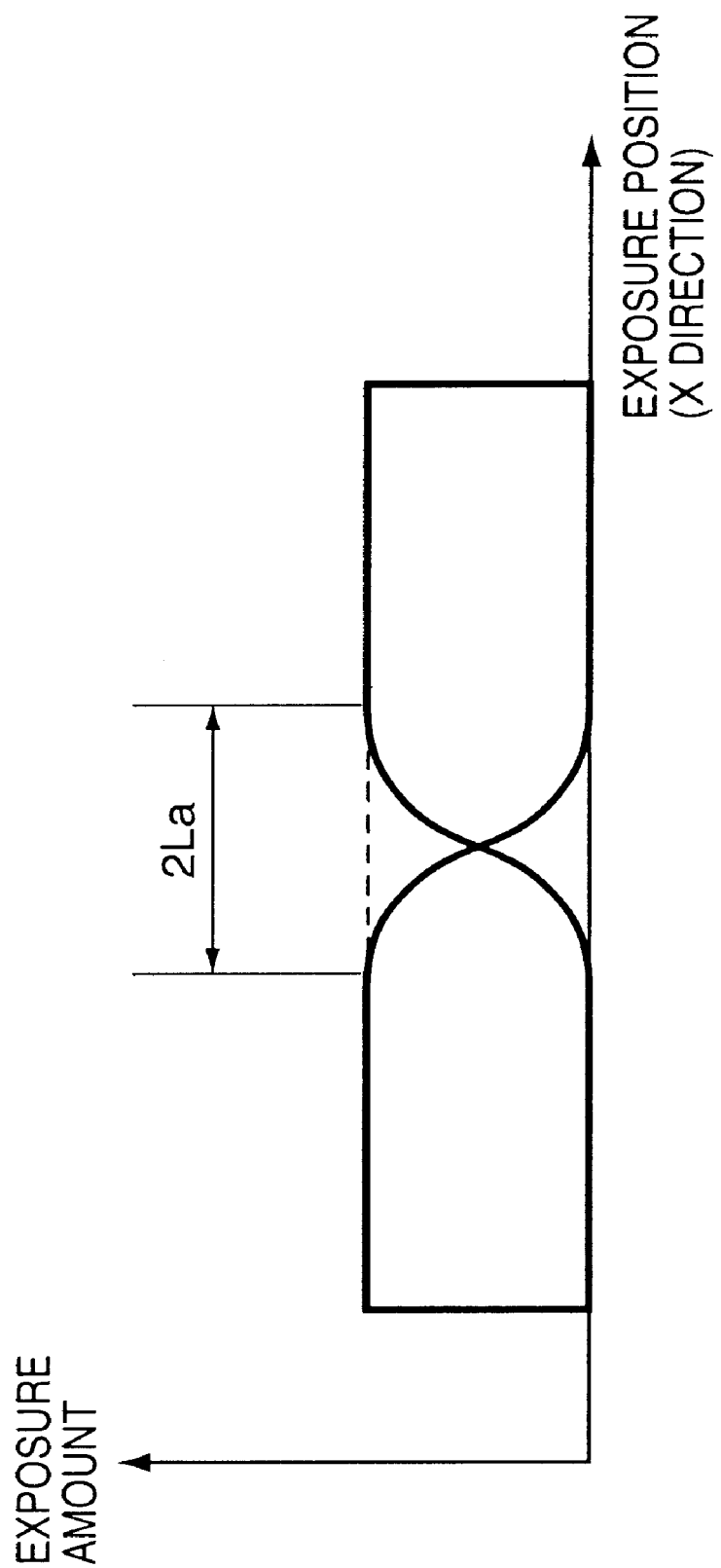

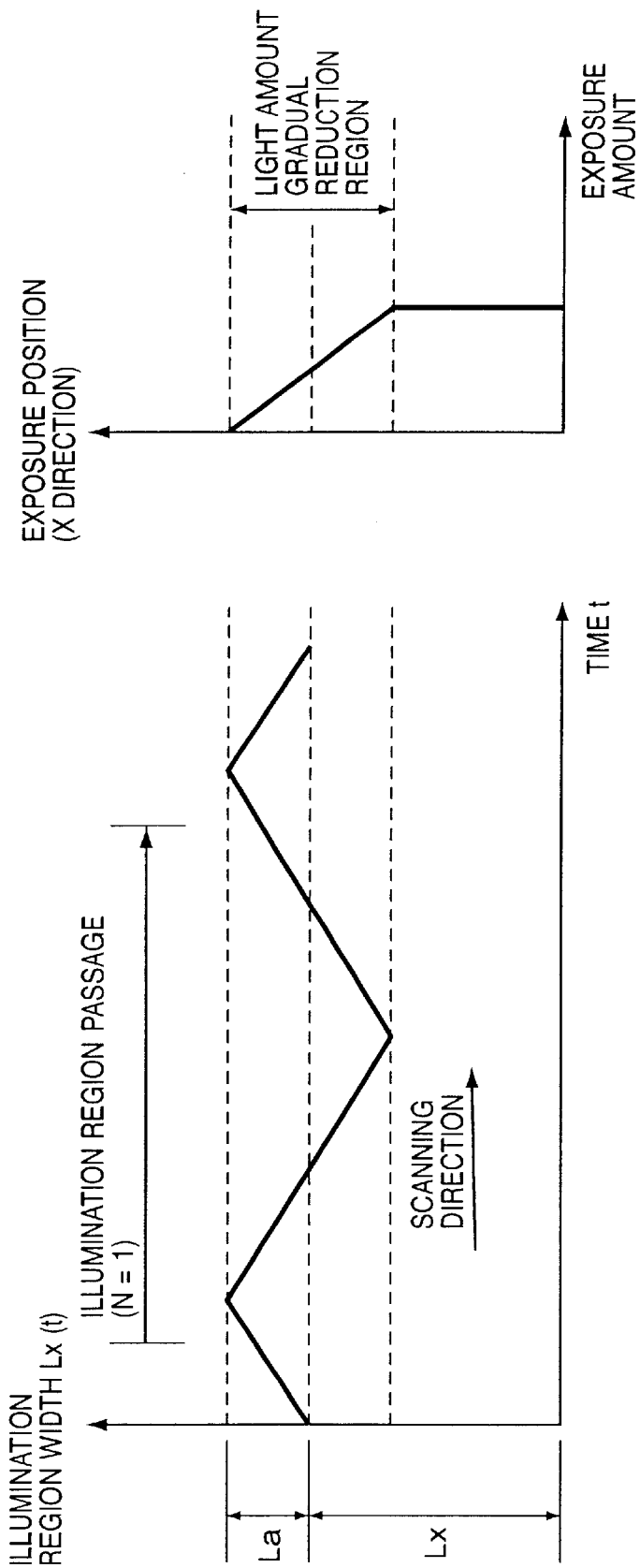

SEMICONDUCTOR DEVICE MANUFACTURING FLOW

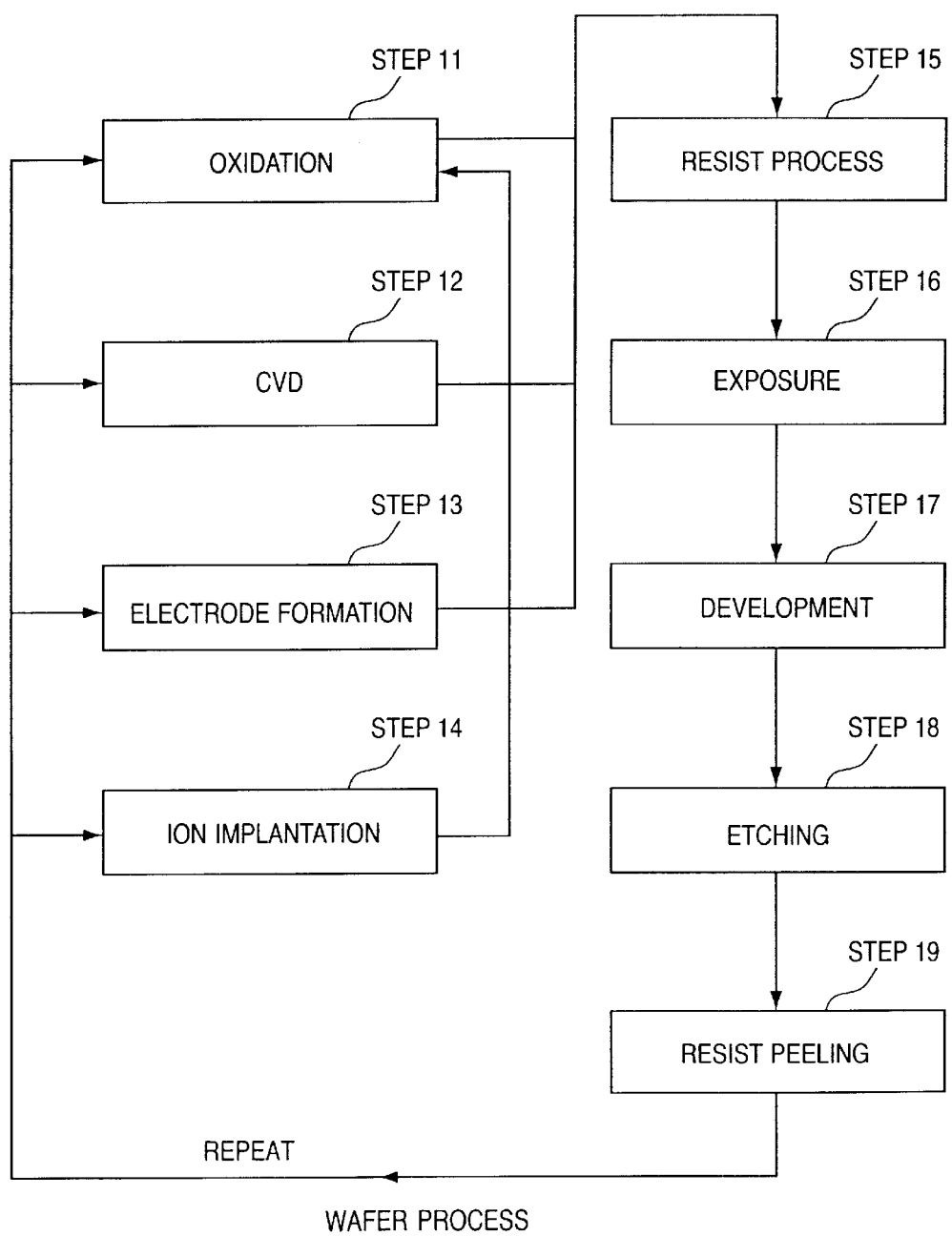

EXPOSURE APPARATUS AND DEVICE MANUFACTURING METHOD

FIELD OF THE INVENTION

The present invention relates to an exposure apparatus and a device manufacturing method used to manufacture a semiconductor element, liquid crystal display element, thin-film magnetic head, or the like, by lithography.

BACKGROUND OF THE INVENTION

To manufacture a semiconductor element by lithography, an exposure apparatus which irradiates a mask having a transfer pattern formed on it with exposure light emitted from a light source to project the pattern onto a photosensitive member through a projection optical system is generally used.

To cope with an increase in view angle of a semiconductor element or the like, a scheme is conventionally used which performs exposure while synchronously scanning a mask and photosensitive member to project a transfer pattern in a region wider than the illumination region.

In recent years, the following method called stitching is used to realize a larger view angle (FIG. 3)

[Step 1] Exposure light is emitted from an exposure light source while synchronously scanning a mask and photosensitive member to perform exposure in an exposure region 31 by first scanning.

[Step 2] For second exposure, the photosensitive member is moved in a direction perpendicular to the scanning direction.

[Step 3] Exposure light is emitted from the exposure light source while synchronously scanning the mask and photosensitive member to perform exposure in a second exposure region 32 which is in contact with the first exposure region 31 by second scanning. The first and second exposure regions are connected by so-called stitching, and consequently, a large transfer pattern (a pattern that forms one electronic circuit) is transferred.

In the prior art, however, exposure unevenness may occur at the connection portion between the exposure region by the first scanning and that by the second scanning.

FIGS. 14A and 14B show exposure amount distributions on a cross section taken along a direction perpendicular to the scanning direction when exposure is performed on the basis of the conventional technique. Ideally, the connection portion has neither superposition nor gap. However, the ideal distribution cannot always be obtained because of, e.g., limited mechanical accuracy. FIG. 14A shows a state wherein an exposure superposed portion $A_1$ is formed at the exposure connection portion between the exposure region by the first scanning and that by the second scanning. In this case, the exposure amount of the portion $A_1$ is larger than that at the remaining positions. On the other hand, FIG. 14B shows a state wherein a portion $A_0$ is present, where no exposure is obtained because of a gap formed at the exposure connection portion by exposure in the first scanning and that in the second scanning. In this case, the portion $A_0$ has an exposure error.

SUMMARY OF THE INVENTION

It is an object of the present invention to further improve the above prior art and provide an exposure apparatus and device manufacturing method which can reduce any exposure unevenness at the connection portion between the exposure region by the first scanning and that by the second scanning by the stitching method.

In order to achieve the above object, according to the present invention, there is provided an exposure apparatus which has an illumination system for transferring a pattern formed on a master onto a photosensitive member by exposure light, a stop for setting an illumination region by the exposure light, and a mechanism for synchronously scanning the master and photosensitive member in predetermined scanning directions, and repeatedly executes exposure by synchronous scanning of the master and photosensitive member and relative movement of the photosensitive member in a direction crossing the scanning direction, thereby forming a transfer pattern with connected exposure regions on the photosensitive member, characterized by comprising a stop driving mechanism for performing exposure while driving the stop, for setting the illumination region in the direction perpendicular to the scanning direction, in the direction crossing the scanning direction in a plane perpendicular to the optical axis of the illumination system upon synchronously scanning the master and photosensitive member.

According to the present invention, there may also be provided an exposure apparatus which has an illumination system for transferring a pattern formed on a master onto a photosensitive member by exposure light, a stop for setting an illumination region by the exposure light, and a mechanism for moving the photosensitive member in a predetermined direction, and repeatedly executes static full plate exposure and relative movement of the photosensitive member, thereby forming a transfer pattern with connected exposure regions on the photosensitive member, characterized by comprising a stop driving mechanism for performing exposure while driving the stop in a plane perpendicular to the optical axis of the illumination system in static full plate exposure. According to the present invention, there is also provided a device manufacturing method characterized by comprising the step of controlling exposure to reduce an exposure amount unevenness at a connection portion between first and second regions in forming a transfer pattern having the first and second regions connected by the first step of exposing and transferring the pattern in the first region on a photosensitive member and the second step of exposing and transferring the pattern in the second region in contact with the first region.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a view showing the schematic arrangement of an exposure apparatus according to the first embodiment of the present invention;

FIG. 3 is a view showing a means for exposing a region wider than the illumination region by exposure in first scanning and that in second scanning according to the first embodiment of the present invention;

FIG. 5 is a graph showing superposition of the exposure amount in the direction perpendicular to the scanning direction when the field stop is periodically sinusoidally driven in the first embodiment of the present invention;

FIGS. 6A and 6B are graphs showing a variation in exposure region width Lx when the field stop is periodically triangularly driven, and the thus obtained exposure amount distribution in the direction perpendicular to the scanning direction, respectively;

FIG. 16 is a flow chart showing details of the wafer process shown in FIG. 15.

DETAILED DESCRIPTION OF THE PREFERRED EMBODIMENTS

Preferred embodiments of the present invention will now be described in detail in accordance with the accompanying drawings.

Outlines of the embodiments will be described first.

An exposure apparatus according to the embodiments uses a means for performing exposure by synchronously scanning a mask and photosensitive member while driving a field stop, for setting an illumination region in a direction perpendicular to the scanning direction, in the direction perpendicular to the scanning direction in a plane perpendicular to the optical axis of the illumination optical system.

Figure 2A:
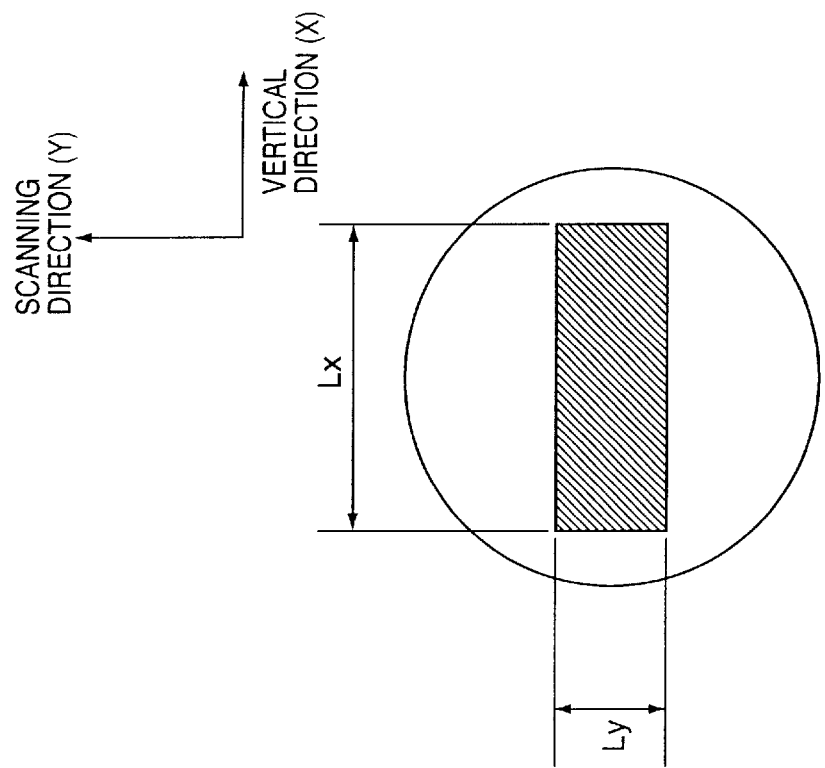
FIGS. 2A and 2B are views showing the shape of a field stop according to the first embodiment of the present invention, and an illumination region on a projection optical system, respectively.

As shown in FIG. 2A, a field stop 2 for setting the illumination region is formed by four vanes which can be independently driven. Reference symbols Bu and Bd denote vanes for setting an illumination region width Ly (FIG. 2B) in the scanning direction; and Bl and Br, vanes for setting an illumination region width Lx (FIG. 2B) in the direction perpendicular to the scanning direction.

The vanes Bu and Bd for setting the illumination region in the scanning direction are fixed during exposure. On the other hand, the vanes Bl and Br for setting the illumination region in the direction perpendicular to the scanning direction are driven during exposure. That is, in each exposure scanning, exposure is performed while driving one of the vanes Bl and Br, which corresponds to the exposure connection portion side.

FIG. 3 shows the exposure sequence of the present invention in exposing a region wider than the illumination region by exposure in first scanning and that in second scanning.

[Step 1] An oscillation frequency F of the field stop is determined by $F = N \times V/Ly$ where V is the synchronous scanning speed, Ly is the illumination region width in the scanning direction, and N is an arbitrary natural number.

[Step 2] In first synchronous scanning, exposure is performed while driving the vane Br as a field stop portion corresponding to the connection portion side (right side) at the frequency F and amplitude La in the direction perpendicular to the scanning direction.

[Step 3] In second synchronous scanning, exposure is performed while driving the vane Bl as a field stop portion corresponding to the connection portion side (left side) at the frequency F and amplitude La in the direction perpendicular to the scanning direction.

The function and effect of the above embodiment will be described in detail. In step 1, Ly/V represents a time required for an arbitrary point on the photosensitive member to pass through the illumination region. More specifically, when the driving frequency F of the field stop is determined on the basis of step 1, the field stop can be set to be always periodically driven N times while the arbitrary point on the photosensitive member is passing through the illumination region.

Figures 4A, 4B:
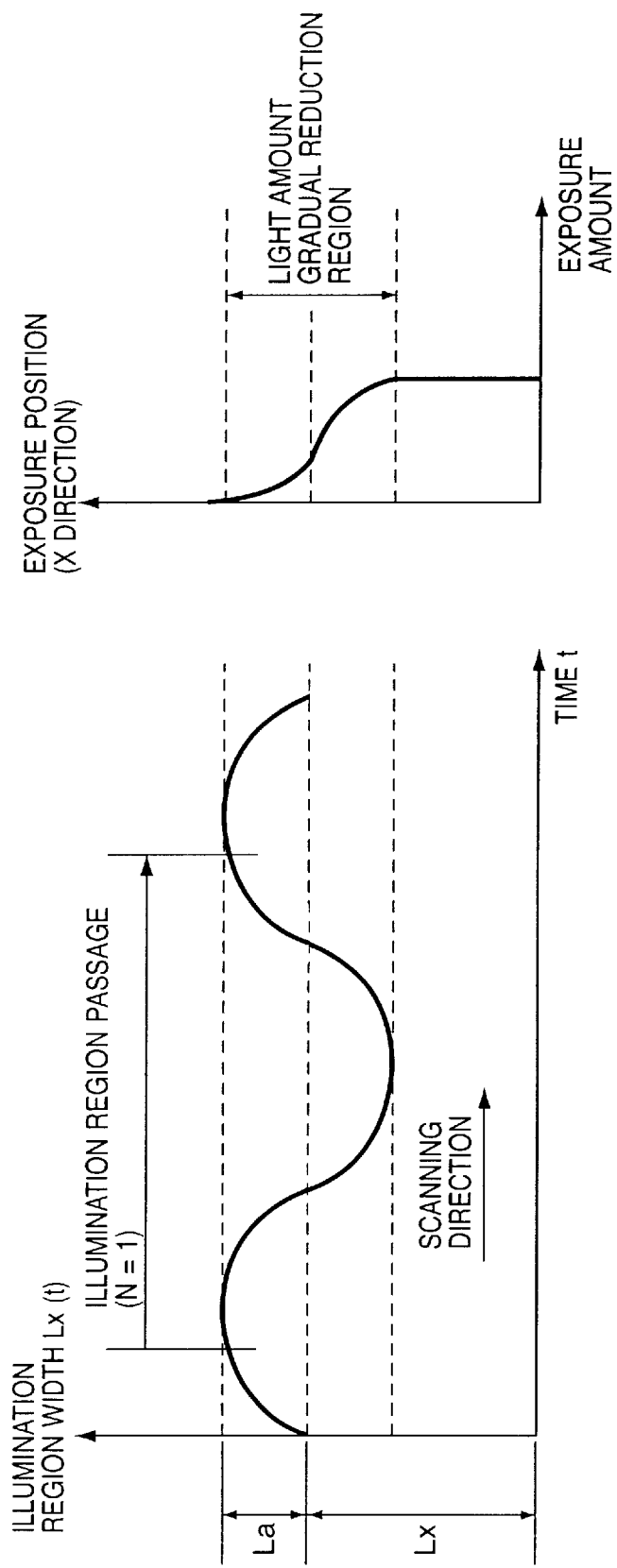
FIGS. 4A and 4B are graphs showing a variation in exposure region width Lx when the field stop is periodically sinusoidally driven, and the thus obtained exposure amount distribution in a direction perpendicular to the scanning direction, respectively.

For example, the relationship between a time t and the illumination region width Lx(t) in the direction perpendicular to the scanning direction when the field stop is periodically sinusoidally driven is shown in FIG. 4A. Referring to FIG. 4A, N+1, and the field stop is periodically driven N=1 times while an arbitrary point on the photosensitive member is passing through the illumination region. For this reason, when this means is used, an exposure amount distribution shown in FIG. 4B is obtained on a cross section taken along the perpendicular to the scanning direction.

When these exposure amount gradual reduction regions are superposed by exposure in the first scanning and that in the second scanning, the exposure amount unevenness at the connection portion can be reduced, as shown in FIG. 5.

Figure 7:
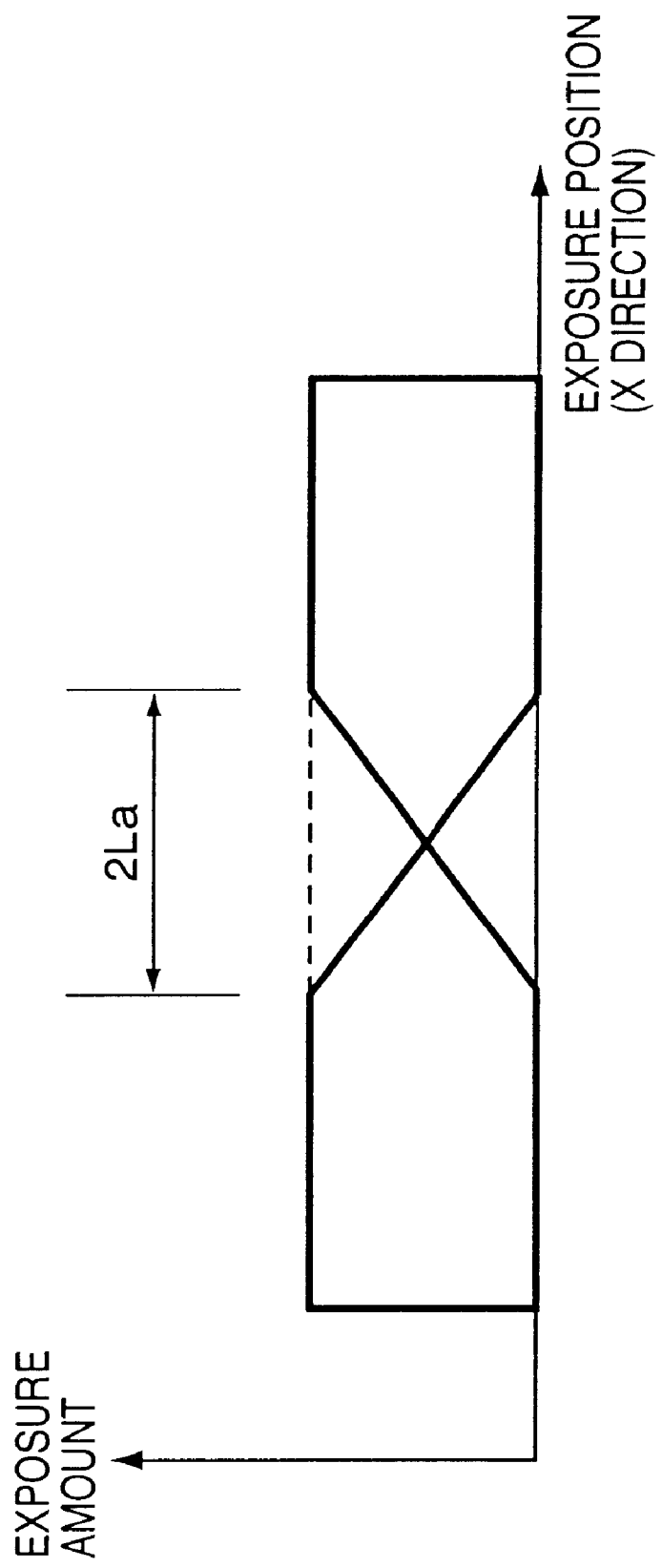
FIG. 7 is a graph showing superposition of the exposure amount in the direction perpendicular to the scanning direction when the field stop is periodically triangularly driven in the first embodiment of the present invention.

As a field stop driving method, not only periodical sinusoidal driving but also various methods including, e.g., periodical triangular driving can be used. FIG. 6A shows the relationship between the time t and the exposure region width Lx when the field stop is periodically triangularly driven, and FIG. 6B shows the thus obtained exposure amount distribution on an arbitrary cross section in the direction perpendicular to the scanning direction. Superposition of the exposure region by the first scanning and that by the second scanning in this case is shown in FIG. 7.

The exposure amount unevenness at the connection portion can be stochastically reduced even by periodically driving the field stop asynchronously with scanning of the mask and photosensitive member or by driving the field stop completely at random.

If exposure is to be performed by scanning three or more times to form exposure connection portions on two sides (e.g., second scanning), exposure is performed while simultaneously driving the two portions Bl and Br of the field stop, and except this time, exposure is performed while driving only one side portion of the field stop, which corresponds to the exposure connection portion, as described above. This realizes exposure with reduced exposure amount unevenness at the connection portions.

According to the present invention, the same effect as described above can be obtained by using either a continuous-emission-type exposure light source such as a mercury lamp or a pulse-emission-type light source such as an ArF excimer laser or KrF excimer laser.

Especially when a pulse-emission-type light source is used, the effect of the present invention can be further improved by synchronizing the pulse emission frequency with the driving frequency of the field stop.

(First Embodiment)

FIG. 1 is a view showing the schematic arrangement of an exposure apparatus according to the first embodiment of the present invention. Referring to FIG. 1, reference numeral 1 denotes an excimer laser source 1 such as an ArF laser serving as an exposure light source; 2, a field stop for setting an illumination region; 3, a reticle as a master having an integrated circuit pattern; 4, a projection optical system having a projection magnification α; and 5, a wafer (semiconductor substrate or glass substrate) as a photosensitive member. The integrated circuit pattern formed on the reticle 3 is projected by exposure onto the wafer 5 through the projection optical system 4. Reference numeral 6 denotes an exposure amount measuring sensor.

Reference numeral 7 denotes a reticle stage for holding the reticle 3; 8, a wafer stage for holding the wafer 5; 9, a reticle stage driving system for driving the reticle stage 7 in the X–Y plane and rotational directions; and 10, a wafer stage driving system for driving the wafer stage 8 in the X–Y plane and rotational directions.

The positions of the reticle stage 7 and wafer stage 8 can be measured by laser interferometers 11 and 12, respectively. A main control system 13 controls the positions of the reticle stage 7 and wafer stage 8 and emission of the laser source 1.

Figure 2B:
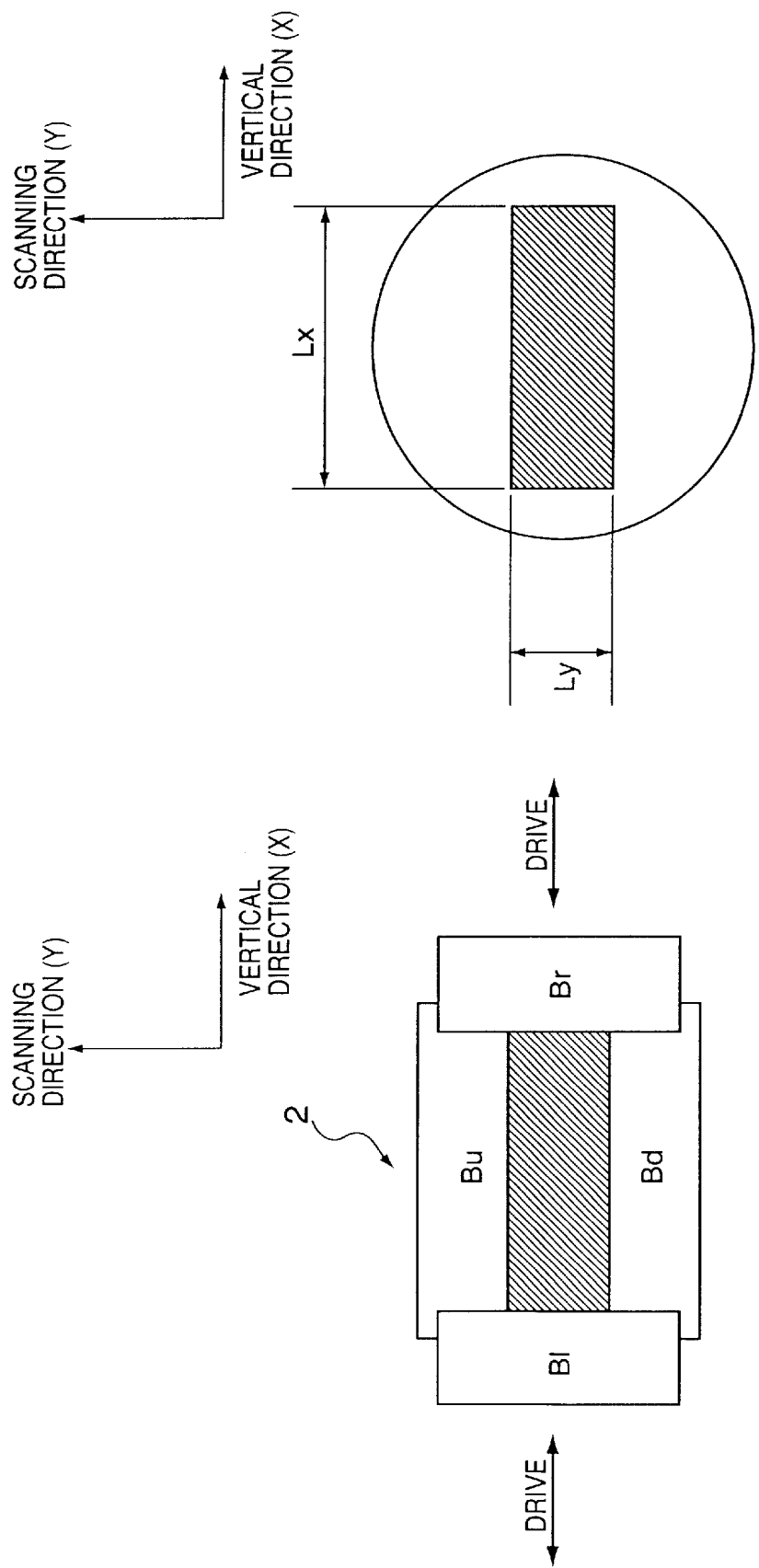

An illumination region is set by the field stop 2. As shown in FIG. 2A, the field stop 2 is formed by four vanes which can be independently driven: vanes Bu and Bd for setting an illumination region width Ly in the scanning direction and vanes Bl and Br for setting an illumination region width Lx in a direction crossing the scanning direction at right angles. FIG. 2B shows a state wherein an illumination region having the width Ly in the scanning direction and the width Lx in the direction perpendicular to the scanning direction is set in a circular projection optical system using the field stop 2.

The exposure apparatus according to this embodiment has a field stop driving system 14 for performing exposure while driving the field stop 2, for setting the illumination region in the direction perpendicular to the scanning direction, in the direction perpendicular to the scanning direction in a plane perpendicular to the optical axis of the illumination optical means in simultaneously scanning the reticle 3 and wafer 5. Driving by the field stop driving system 14 can be done by sinusoidally oscillating an arbitrary one or both of the vanes Bl and Br.

An exposure sequence of exposing a region wider than the exposure field by exposure in first scanning and that in second scanning by the step-and-scan method using the exposure apparatus of this embodiment will be described with reference to FIG. 3.

[Step 1] The synchronous scanning speeds of the reticle stage 7 and wafer stage 8, the output energy of the laser source 1, and the oscillation frequency are determined from the set exposure amount.

[Step 2] The illumination region width Ly in the scanning direction and the illumination region width Lx in the direction perpendicular to the scanning direction are set by the field stop 2. The illumination region width Lx is the illumination region width (FIG. 4A) as the center of driving.

[Step 3] A driving frequency F of the field stop 2 is obtained from a driving speed V of the reticle stage 7 and the illumination region width Ly. In this embodiment, this driving frequency F can be obtained by $F=N \times V/Ly$ where N is an arbitrary integer.

[Step 4] The reticle 3 and wafer 5 are aligned for the first scanning.

[Step 5] Exposure is performed by emitting a laser beam from the laser source 1 at a predetermined interval while driving the reticle stage 7 at the constant speed V in the Y direction, the wafer stage 8 at a constant speed $\alpha V$ in the $-Y$ direction, and also sinusoidally driving the field stop Br at the driving frequency F obtained in step 3 in the direction perpendicular to the scanning direction.

[Step 6] When the first scanning is ended, the wafer stage 8 is driven stepwise and moved in the direction perpendicular to the scanning direction by a distance $\Delta Lx$.

[Step 7] The reticle 3 is exchanged with another reticle, as needed.

[Step 8] The reticle 3 and wafer 5 are aligned for the second scanning.

[Step 9] Exposure is performed by emitting a laser beam from the laser source 1 at a predetermined interval while driving the reticle stage 7 at the constant speed V in the $-Y$ direction (or Y direction), the wafer stage 8 at the constant speed $\alpha V$ in the Y direction (or $-Y$ direction), and also performing driving by the field stop driving means to sinusoidally oscillate the field stop Bl at the driving frequency F obtained in step 3 in the direction perpendicular to the scanning direction.

As described above, when the exposure apparatus of the present invention is used, any exposure amount unevenness at the connection portion between the exposure region by the first scanning and that by the second scanning can be properly reduced to almost make uniform the total exposure amount in the connection region and the remaining exposure regions (FIGS. 4A, 4B and 5). As the field stop driving method, not only periodical sinusoidal driving but also various methods including, e.g., periodical triangular driving can be used (FIGS. 6A, 6B and 7).

(Second Embodiment)

Figure 8:
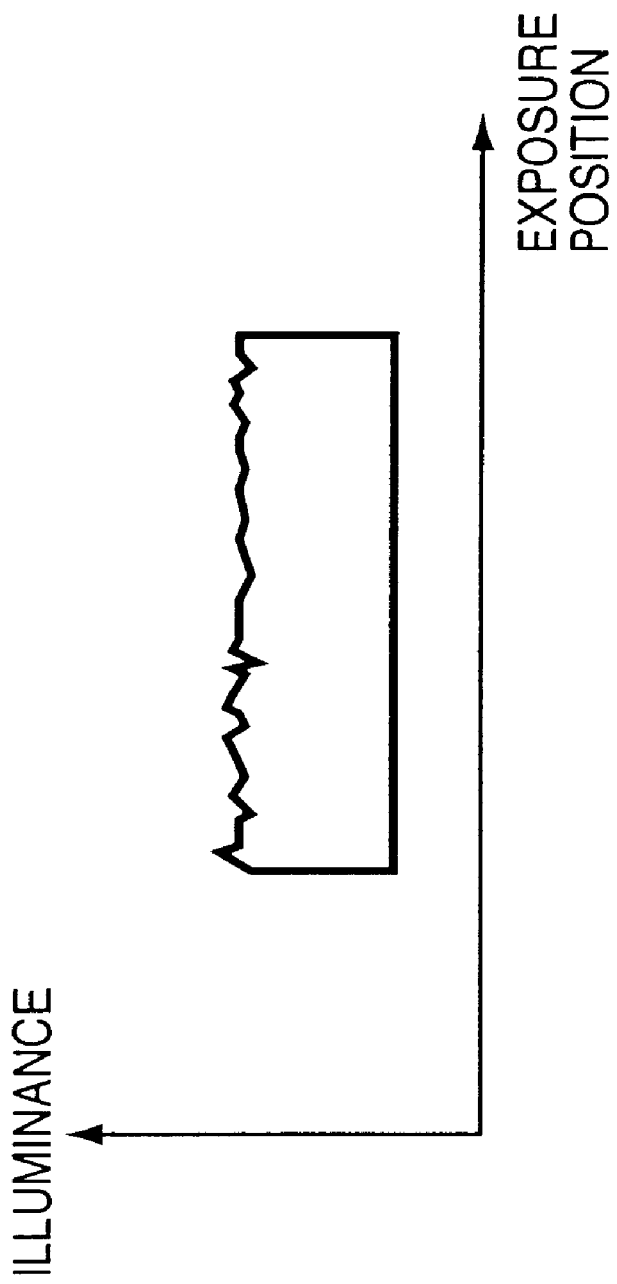
FIG. 8 is a graph showing illuminance unevenness for a pulse generated when an excimer laser is used as an exposure light source in the second embodiment of the present invention.

When a pulse-emission-type light source such as an excimer laser is used as the exposure light source, the illuminance distribution of the obtained laser pulses is not uniform but uneven, as shown in FIG. 8. When exposure is performed using a plurality of pulses, exposure regions are preferably superposed while shifting the phase to reduce any illuminance unevenness of the laser pulses.

Figure 9:
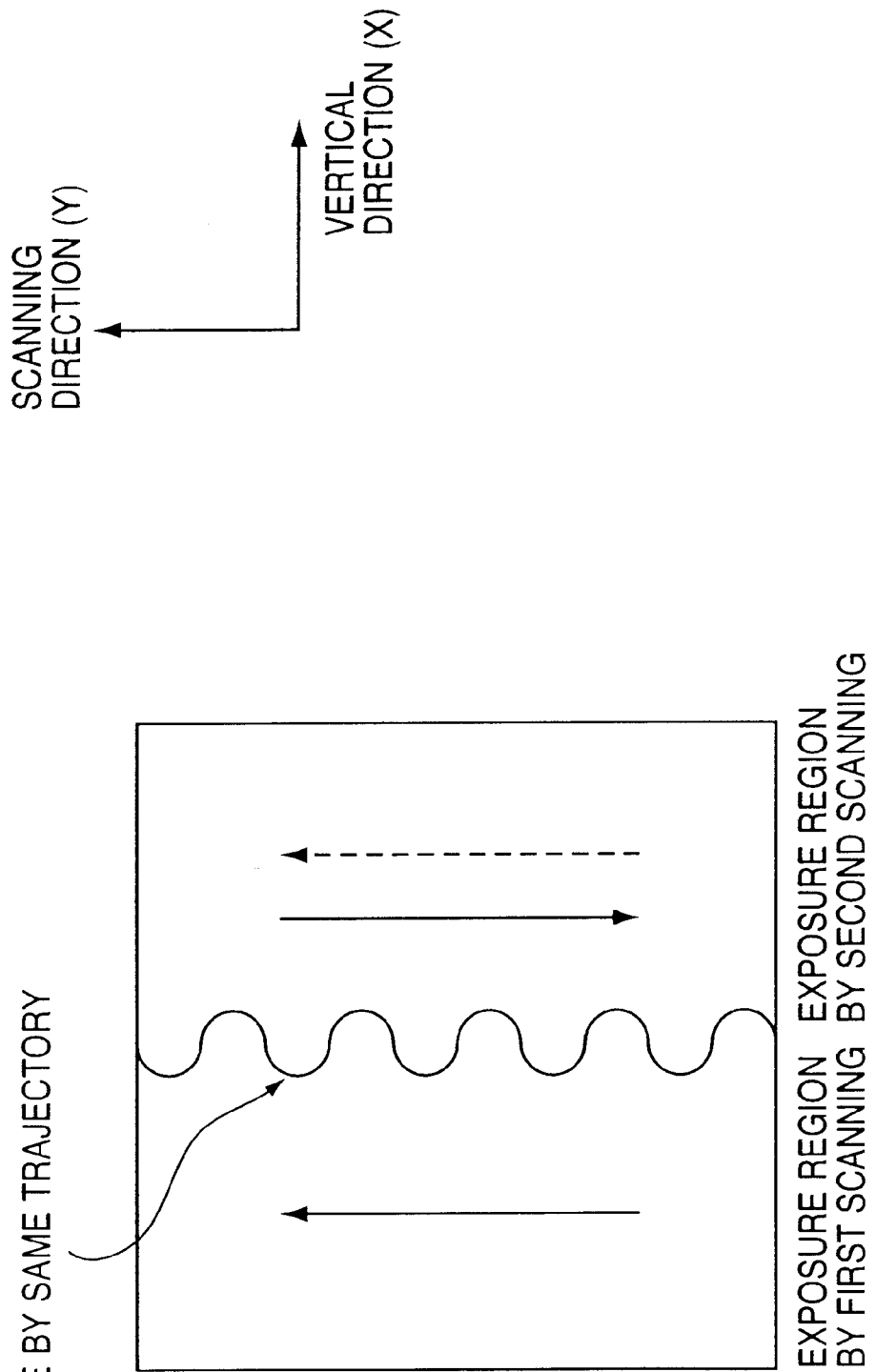
FIG. 9 is a view showing matching between the trajectory of the field stop in first scanning and that in second scanning in the second embodiment of the present invention.

An exposure apparatus according to the second embodiment of the present invention uses a field stop driving means for making the trajectory of driving of a field stop 2 in second scanning match the connected trajectory of driving of the field stop in first scanning. Referring to FIG. 9, as an example, a vane Br of the field stop 2 is sinusoidally driven by the first scanning, and a vane Bl of the field stop 2 is sinusoidally driven by the second scanning on the same trajectory as that of the vane Br. The scanning direction of the second scanning can be either +Y or −Y direction.

Figure 10:
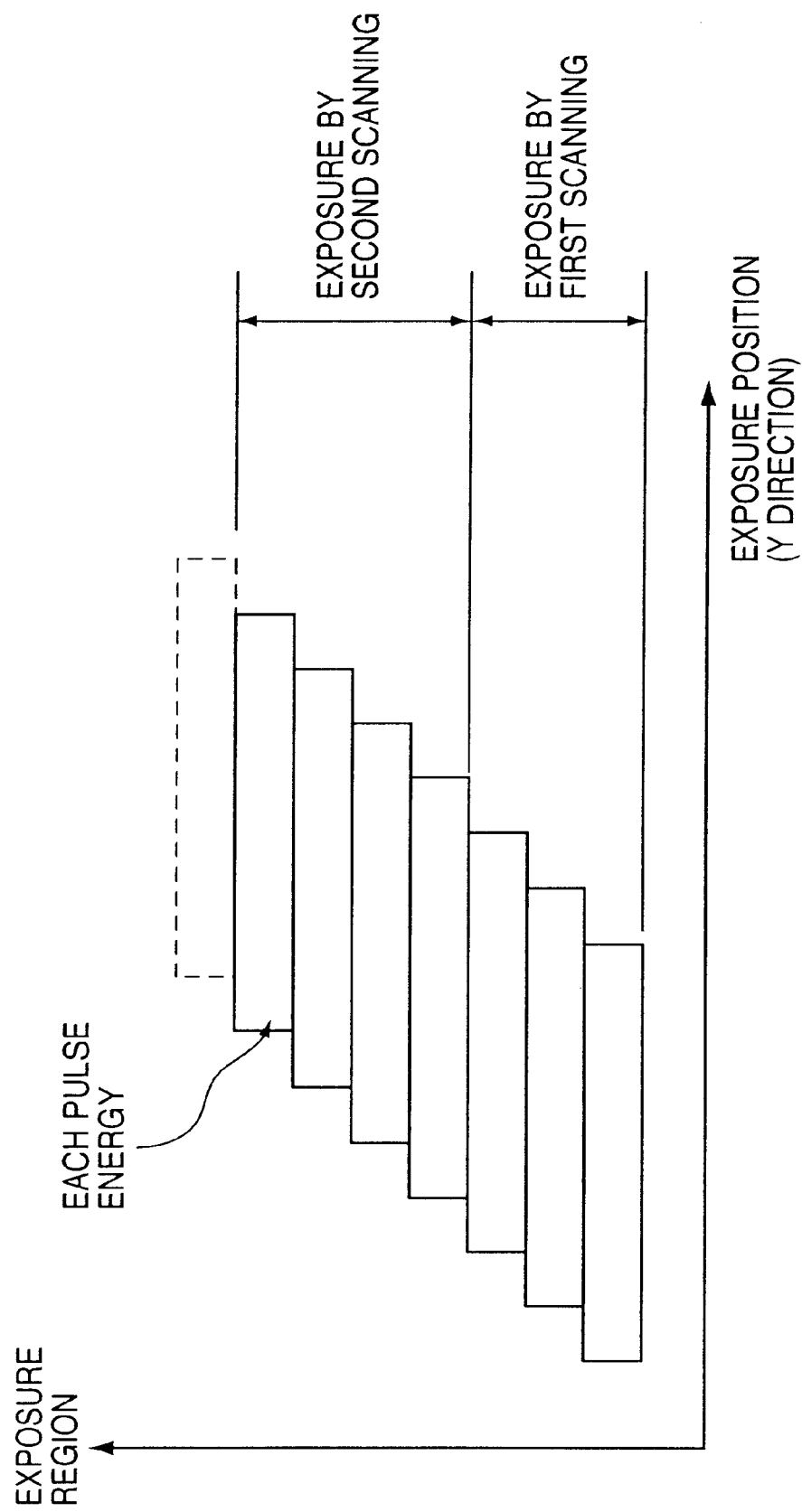
FIG. 10 is a graph showing a state wherein unevenness for each pulse at the exposure connection portion is reduced by exposure in the first scanning and that in the second scanning according to the second embodiment of the present invention.

FIG. 10 shows the relationship between the exposure amount on a cross section and the scanning-direction exposure position at the exposure connection portion when the field stop driving system of this embodiment is used.

Referring to FIG. 10, exposure regions by three pulses of the first scanning and those by four pulses of the second scanning are superposed in continuous phases. The exposure regions are always superposed in continuous phases, though the number of exposure pulses by the first scanning and that by the second scanning change depending on the cross section. For this reason, any exposure amount unevenness at the exposure connection portion can be reduced. In a uniform exposure region except the exposure connection portion, exposure having the same phase shift as shown in FIG. 10 can always be obtained by one scanning cycle.

In the above example, the exposure amount may be measured using an exposure amount measuring sensor 6, the driving positions of the vanes Bl and Br of the field stop 2 may be corrected by the field stop driving system, and the exposure amount at the exposure connection portion may be corrected by this position correction.

In addition, the position of the field stop 2 may be corrected at a timing during scanning on the basis of the exposure amount at that time. Alternatively, the position of the field stop 2 for the next scanning may be corrected on the basis of the exposure amount obtained by the preceding scanning.

(Third Embodiment)

Figure 11:
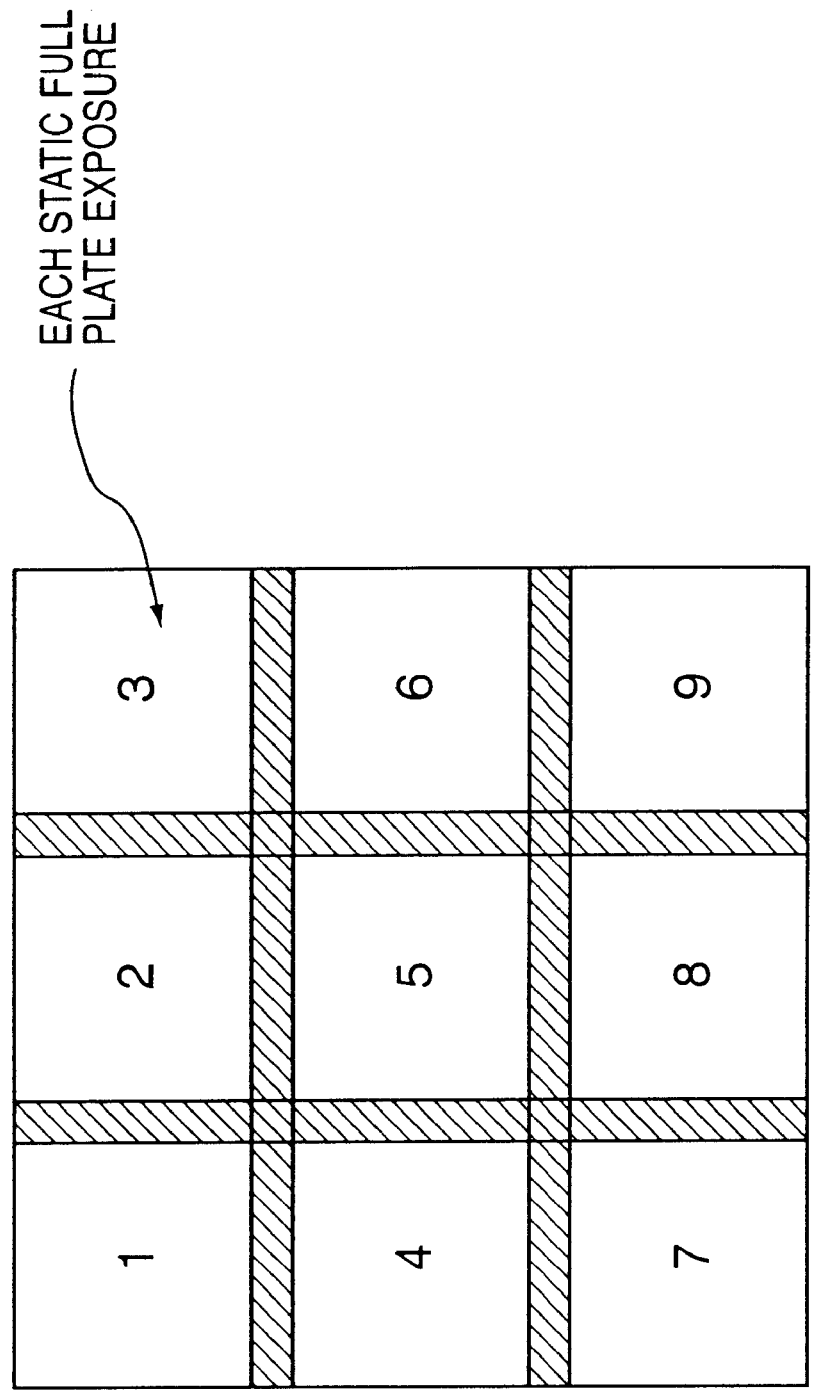
FIG. 11 is a view showing a means for exposing a region wider than an illumination region by static full plate exposure of a plurality of number of times in the third embodiment of the present invention.

The third embodiment of the present invention employs a technique of transferring a reticle pattern having a region wider than an illumination region onto a wafer 5 by the step-and-repeat method using an exposure apparatus of static full plate exposure type without generating exposure amount unevenness at the exposure connection portion. FIG. 11 shows an example in which exposure is performed by executing static full plate exposure nine times divisionally for nine square regions 1 to 9. The hatched portions in FIG. 11 indicate exposure connection portions.

Figure 12:
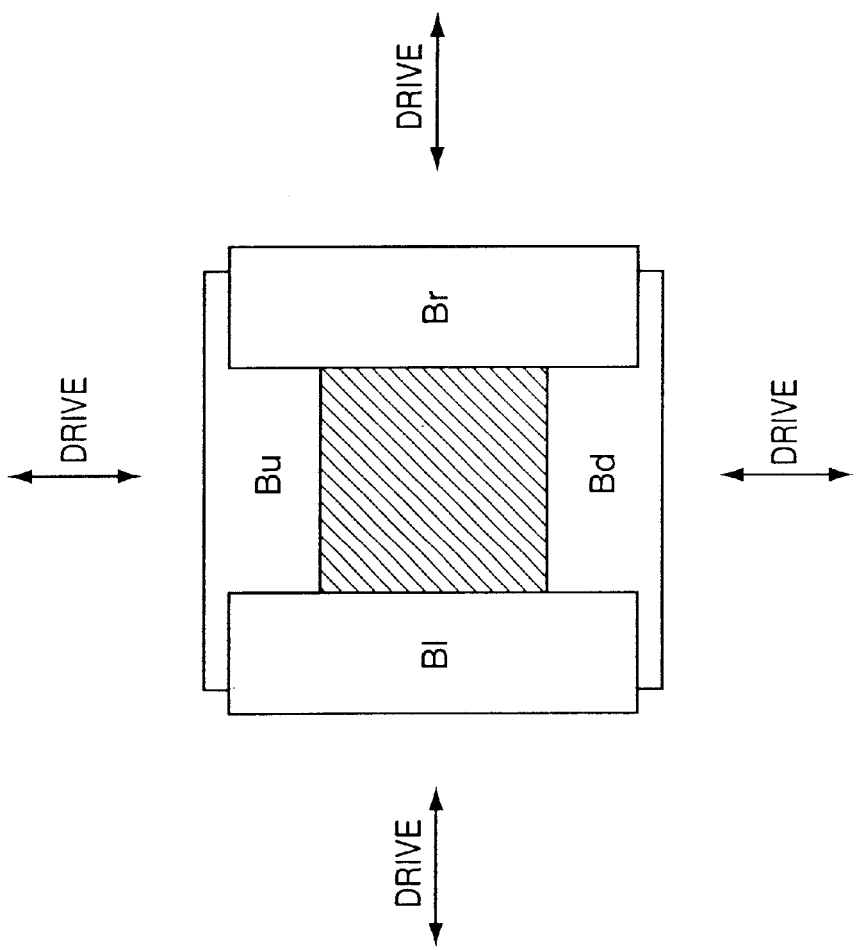
FIG. 12 is a view showing the shape of a field stop according to the third embodiment of the present invention.

As an exposure apparatus of this embodiment, the arrangement shown in FIG. 1 can be used. FIG. 12 shows the structure of a field stop 2 of the exposure apparatus according to this embodiment. In this embodiment, a field stop driving system 14 drives some of four vanes Bu, Bd, Bl, and Br of the field stop 2, which correspond to exposure connection portion sides, and keeps the remaining vanes corresponding to the exposure non-connection portion sides fixed in position. For example, in static full plate exposure of region 1 out of regions 1 to 9 shown in FIG. 11, the vanes Bd and Br of the field stop 2 are driven in correspondence with the positions of exposure connection portions. In static full plate exposure of region 5, all the vanes Bu, Bd, Bl, and Br of the field stop 2 are driven.

Figure 13:
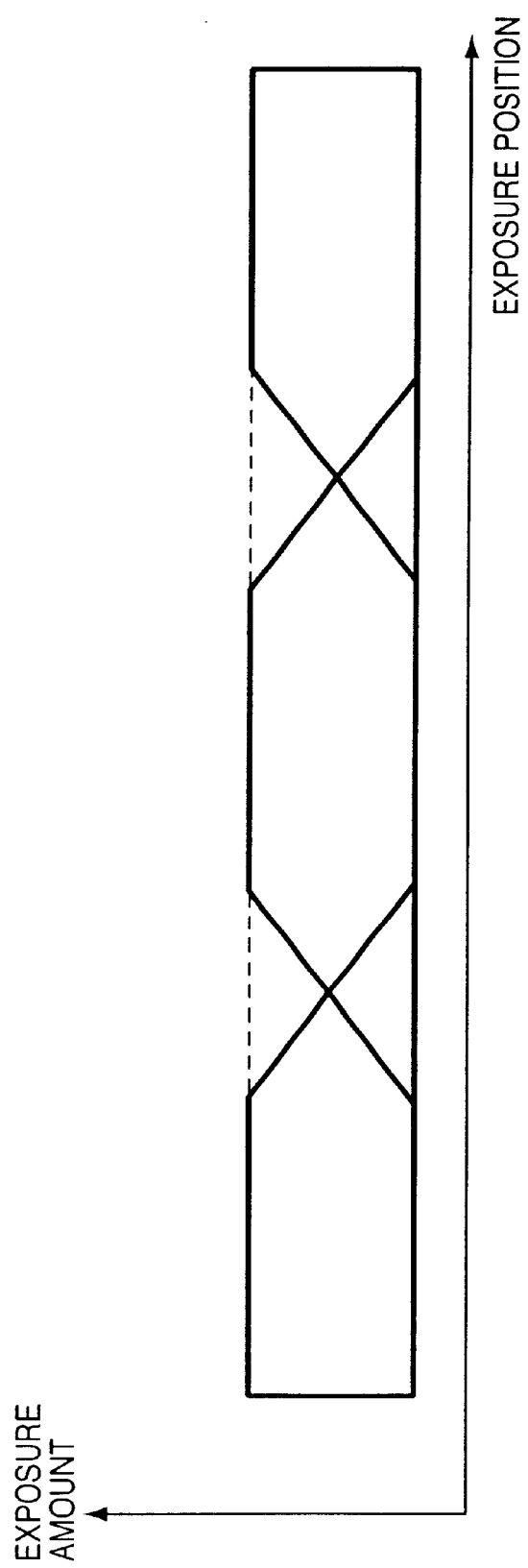
FIG. 13 is a graph showing an exposure amount distribution according to the third embodiment of the present invention.
Figure 14A:
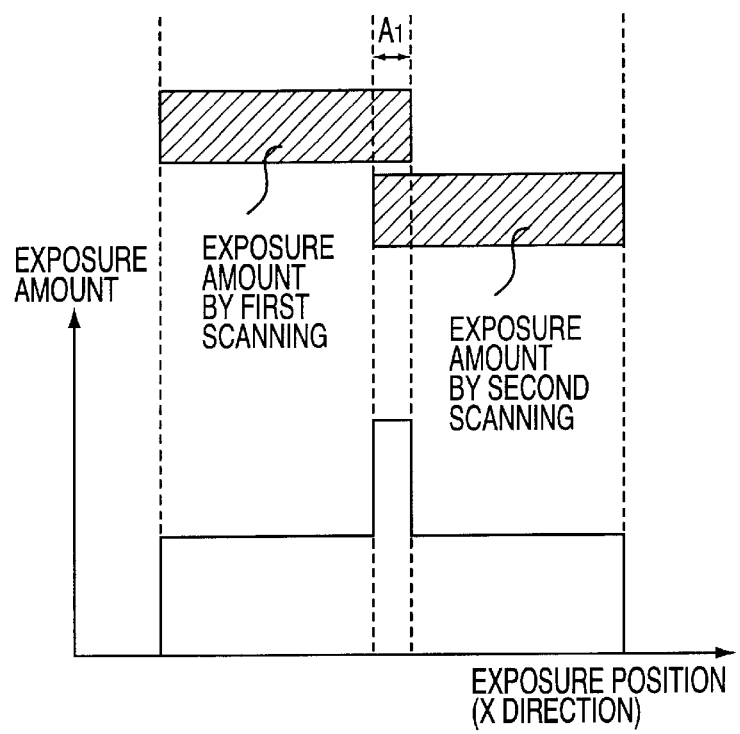
FIGS. 14A and 14B are graphs showing superposition of the exposure amount in a direction perpendicular to the scanning direction in a prior art.
Figure 14B:
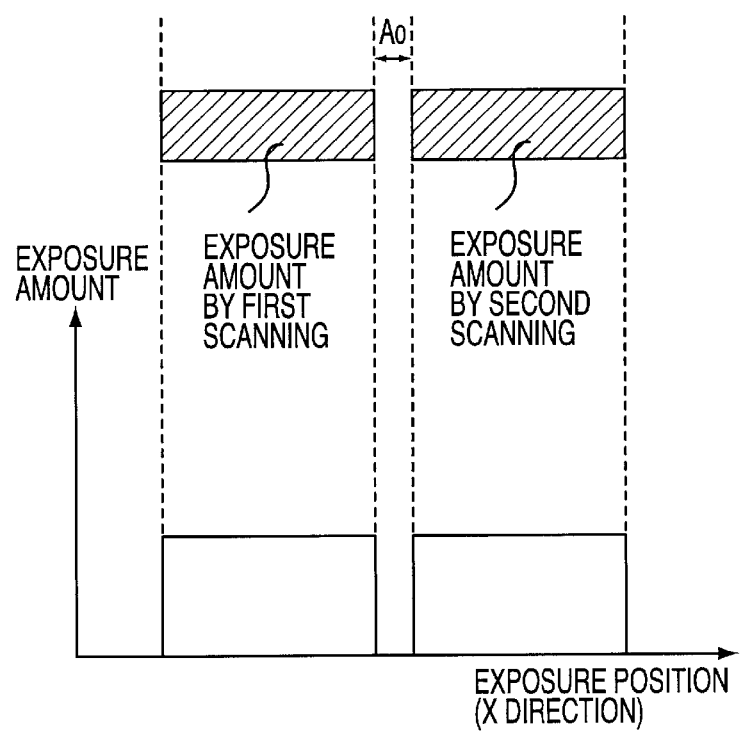

As an example, an exposure amount distribution given when the field stop 2 is driven outward or inward at a predetermined speed during static full plate exposure is shown in FIG. 13. When these light amount gradual reduction regions are superposed as shown in FIG. 13, any exposure amount unevenness at the exposure connection portions can be reduced.

As another driving method for the field stop 2, various settings can be made within such a range that the total exposure amount of the connection portions given by static full plate exposure of a plurality of number of times equals the set exposure amount.

In addition, when the exposure amount is measured using an exposure amount measuring sensor 6, and the driving position of the field stop 2 is corrected on the basis of the measured exposure amount, the exposure amount of each connection portion can be corrected.

Figure 15:
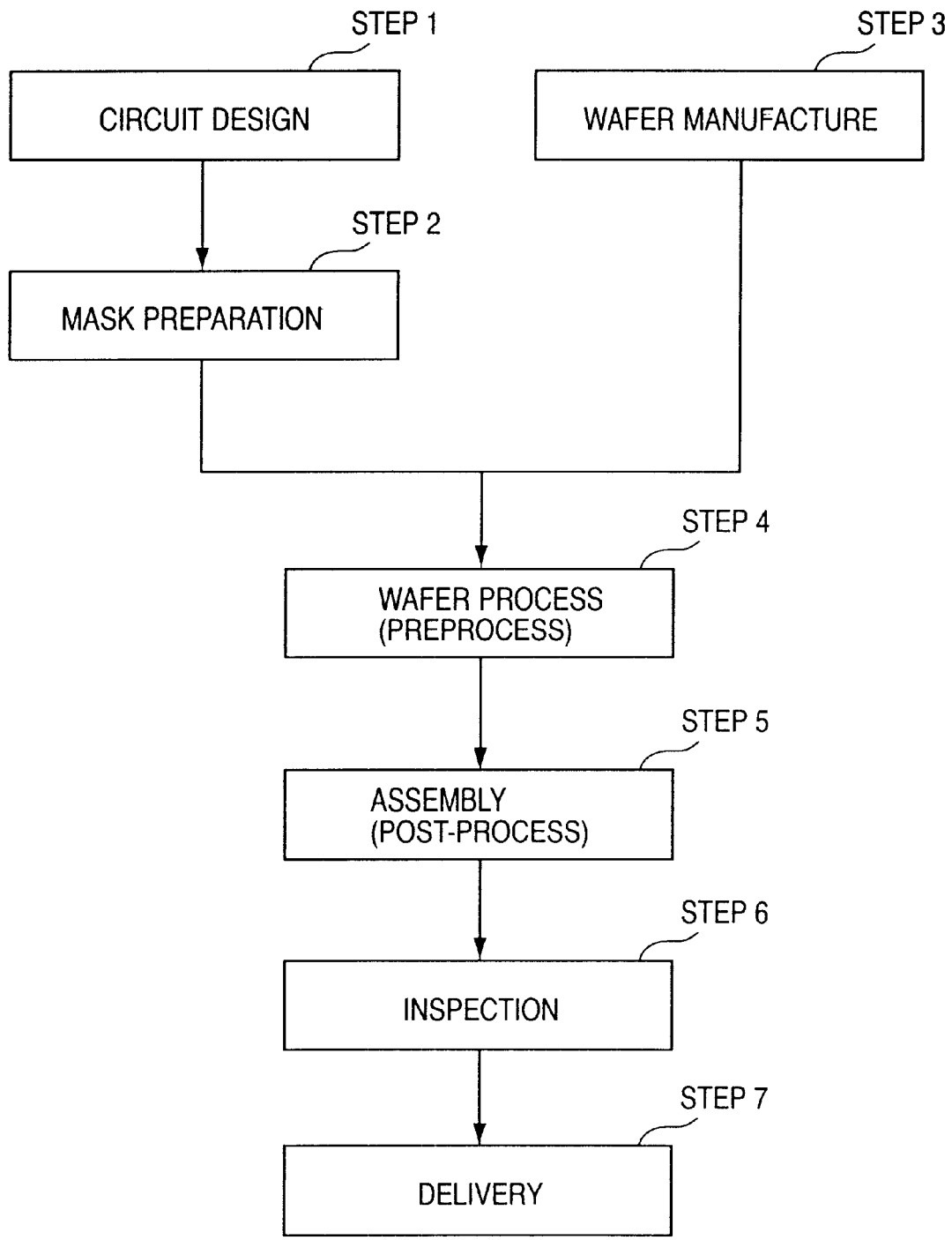
FIG. 15 is a flow chart for explaining an embodiment of a semiconductor device manufacturing method using the exposure apparatus or method of the present invention.

An embodiment of a device production method using the above-described exposure apparatus will be described next. FIG. 15 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask (reticle) having the designed pattern is prepared. In step 3 (wafer manufacture), a wafer is manufactured using a material such as silicon or glass. In step 4 (wafer process) called a preprocess, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

FIG. 16 shows the detailed flow of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is printed on the wafer by exposure using the above-described exposure apparatus or method. In step 17 (development), the exposed wafer is developed. In step 18 (etching), portions other than the developed resist image are etched. In step 19 (resist peeling), any unnecessary resist remaining after etching is removed. By repeating these steps, a multilayered structure of circuit patterns is formed on the wafer.

When the production method of this embodiment is used, a device with a high degree of integration, which is conventionally difficult to manufacture, can be manufactured at low cost.

As described above, according to the present invention, any exposure amount unevenness at the connection portion between the exposure region by the first scanning and that by the second scanning can be properly reduced.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus having an illumination system for transferring a pattern formed on a master onto a photosensitive member by exposure light and a stop for setting an illumination region on the photosensitive member by the exposure light, said apparatus comprising:

an exposure control system for forming a plurality of exposure regions by performing exposure while scanning the illumination region on the photosensitive member in a first direction, the plurality of exposure regions forming a transfer pattern on the photosensitive member by connecting the formed exposure regions in a second direction perpendicular to the first direction with regions superposed on each other; and a stop driving system for, in forming the exposure regions, driving the stop and controlling an aperture portion of the stop to form a region where an exposure light amount gradually decreases outward from the exposure regions in the superposed regions of the exposure regions, wherein the aperture of the stop is formed by a plurality of vanes, and said stop driving system moves a vane of the stop on a side of the superposed regions in the second direction during the scanning in the first direction.

2. The apparatus according to claim 1, wherein movement of the vane by said stop driving system is a reciprocal operation repeated at a predetermined period.

3. A The apparatus according to claim 2, wherein the reciprocal operation is sinusoidal or triangular.

4. The apparatus according to claim 2, wherein the predetermined period is determined on the basis of a length of the illumination region along the first direction and a scanning speed in the first direction by said exposure control system.

5. The apparatus according to claim 4, wherein the predetermined period is a natural number multiple of a value obtained by dividing the scanning speed by the length of the illumination region along the first direction.

6. The apparatus according to claim 2, wherein
the exposure light is emitted from a pulse-emission-type light source, and
said stop driving system synchronizes an emission frequency of pulses with the predetermined period of the stop.

7. The apparatus according to claim 1, wherein, during scanning in the first direction, said stop driving system drives a vane of the stop, which corresponds to a side of a connection portion between the exposure regions and keeps a vane of the stop, which corresponds to a side of a non-connection portion between the exposure regions, fixed in position.

8. The apparatus according to claim 1, wherein in forming a new exposure region connected to an already formed exposure region, said stop driving system moves the vanes to make moving trajectories of the vanes substantially match in the superposed regions of the exposure regions.

9. The apparatus according to claim 1, further comprising:
measurement means for measuring the exposure amount; and
correction means for correcting a position in driving the stop on the basis of an exposure amount measurement result obtained by said measurement means.

10. The apparatus according to claim 1, further comprising:
measurement means for measuring the exposure amount; and
correction means for correcting a position in driving the stop in synchronous scanning from the next cycle on the basis of an exposure amount measurement result obtained by said measurement means.

11. The apparatus according to claim 1, wherein
said exposure control system forms the exposure regions by performing exposure by static full plate exposure in the illumination region on the photosensitive member,
the stop forms the aperture portion formed by a plurality of vanes, and
said stop driving system moves a vane of the stop in the superposed regions during exposure processing by the static full plate exposure.

12. The apparatus according to claim 11, wherein said stop driving system rectilinearly moves the vane corresponding to the superposed regions during the exposure processing.

13. The apparatus according to claim 11, wherein, in said stop driving system, a driving pattern of each stop is determined to make a total exposure amount of each connection portion between the plurality of exposure regions equal to a set exposure amount.

14. The apparatus according to claim 11, wherein, during the exposure process, said stop driving system drives a vane corresponding to a side of a connection portion between the exposure regions and keeps a vane corresponding to a side of a non-connection portion between the exposure regions fixed in position.

15. The apparatus according to claim 11, further comprising:
measurement means for measuring the exposure amount; and
correction means for correcting a position in driving the stop on the basis of an exposure amount measurement result obtained by said measurement means.

16. The apparatus according to claim 11, further comprising:
measurement means for measuring the exposure amount; and
correction means for correcting a position in driving the stop in synchronous scanning from the next cycle on the basis of an exposure amount measurement result obtained by said measurement means.

17. The apparatus according to claim 1, further comprising a continuous-emission-type light source for emitting the exposure light.

18. The apparatus according to claim 17, wherein said continuous-emission-type light source comprises a mercury lamp.

19. The apparatus according to claim 1, further comprising a pulse-emission-type light source for emitting the exposure light.

20. The apparatus according to claim 19, wherein said pulse-emission-type light source comprises one of an ArF excimer laser and a KrF excimer laser.

21. An exposure method for an exposure apparatus having an illumination system for transferring a pattern formed on a master onto a photosensitive member by exposure light and a stop for setting an illumination region on the photosensitive member by the exposure light, said method comprising:

an exposure step of forming an exposure region by performing exposure while scanning the illumination region on the photosensitive member in a first direction;

an exposure control step of forming a plurality of exposure regions by connecting the formed exposure regions in a second direction perpendicular to the first direction with regions superposed on each other by repeatedly executing the exposure step, thereby forming the transfer pattern on the photosensitive member; and a stop driving step of, in forming the exposure regions in the exposure step, driving the stop and controlling an aperture portion of the stop to form a gradual reduction region where an exposure light amount gradually decreases outward from the exposure regions in the superposed regions of the exposure regions, wherein the aperture of the stop is formed by a plurality of vanes, and said stop driving step comprises moving a vane of the stop on a side of the superposed regions in the second direction during the scanning in the first direction.

22. The method according to claim 21, wherein movement of the vane in the stop driving step is a reciprocal operation repeated at a predetermined period.

23. The method according to claim 22, wherein the reciprocal operation is sinusoidal or triangular.

24. The method according to claim 22, wherein the predetermined period is determined on the basis of a length of the illumination region along the first direction and a scanning speed in the first direction in the exposure control step.

25. The method according to claim 24, wherein the predetermined period is a natural number multiple of a value obtained by dividing the scanning speed by the length of the illumination region along the first direction.

26. The method according to claim 22, wherein
the exposure light is light emitted from a pulse-emission-type light source, and
the stop driving step comprises synchronizing an emission frequency of pulses with the predetermined period of the stop.

27. The method according to claim 21, wherein the stop driving step comprises, during scanning in the first direction, driving a vane of the stop, which corresponds to a side of a connection portion between the exposure regions and keeping a vane of the stop, which corresponds to a side of a non-connection portion between the exposure regions, fixed in position.

28. The method according to claim 21, the stop driving step comprises, in forming a new exposure region connected to an already formed exposure region, moving the vanes to make moving trajectories of the vanes substantially match in the superposed regions of the exposure regions.

29. The method according to claim 21, further comprising:
the measurement step of measuring the exposure amount; and
the correction step of correcting a position in driving the stop on the basis of an exposure amount measurement result obtained in the measurement step.

30. The method according to claim 21, further comprising:
the measurement step of measuring the exposure amount; and
the correction step of correcting a position in driving the stop in synchronous scanning from the next cycle on the basis of an exposure amount measurement result obtained in the measurement step.

31. The method according to claim 21, wherein
the exposure control step comprises forming the exposure regions by performing exposure by static full plate exposure in the illumination region on the photosensitive member,
the stop forms the aperture portion formed by a plurality of vanes, and
the stop driving step comprises moving a vane of the stop in the superposed regions during exposure processing by the static full plate exposure.

32. The method according to claim 21, wherein the stop driving step comprises rectilinearly moving the vane corresponding to the superposed regions during the exposure processing.

33. The method according to claim 21, wherein the stop driving step comprises determining a driving pattern of each stop to make a total exposure amount of each connection portion between the plurality of exposure regions equal to a set exposure amount.

34. The method according to claim 21, wherein the stop driving step comprises, during the exposure processing, driving a vane corresponding to a side of a connection portion between the exposure regions and keeping a vane corresponding to a side of a non-connection portion between the exposure regions fixed in position.

35. The method according to claim 21, further comprising:
the measurement step of measuring the exposure amount; and
the correction step of correcting a position in driving the stop on the basis of an exposure amount measurement result obtained in the measurement step.

36. The method according to claim 21, further comprising:
the measurement step of measuring the exposure amount; and
the correction step of correcting a position in driving the stop in synchronous scanning from the next cycle on the basis of an exposure amount measurement result obtained in the measurement step.

37. A device manufacturing method of manufacturing a semiconductor device, said method comprising:
a step of supplying a substrate to an exposure apparatus; and
a step of transferring a pattern formed on a master onto the substrate using the exposure apparatus,
wherein the exposure apparatus comprises:
(i) an illumination system for transferring a pattern formed on a master onto a photosensitive member by exposure light;
(ii) a stop for setting an illumination region on the photosensitive member by the exposure light;
(iii) an exposure control system for forming a plurality of exposure regions by performing exposure while scanning the illumination region on the photosensitive member in a first direction, the plurality of exposure regions forming a transfer pattern on the photosensitive member by connecting the formed exposure regions in a second direction perpendicular to the first direction with regions superposed on each other; and
(iv) a stop driving system for, in forming the exposure regions, driving the stop and controlling an aperture portion of the stop to form a region where an exposure light amount gradually decreases outward from the exposure regions in the superposed regions of the exposure regions,
wherein the aperture of the stop is formed by a plurality of vanes, and said stop driving system moves a vane of the stop on a side of the superposed regions in the second direction during scanning in the first direction.

* * * * *

UNITED STATES PATENT AND TRADEMARK OFFICE
CERTIFICATE OF CORRECTION

PATENT NO. : 6,608,667 B2
DATED : August 19, 2003
INVENTOR(S) : Hiroyuki Koide et al.

It is certified that error appears in the above-identified patent and that said Letters Patent is hereby corrected as shown below:

Column 6,
Line 29, "Δ Lx" should read -- αLx --.

Column 9,
Line 15, "A" should be deleted.

Column 11,
Line 30, "the stop" should read -- wherein the stop --.

Signed and Sealed this

Ninth Day of March, 2004

JON W. DUDAS
*Acting Director of the United States Patent and Trademark Office*